United States Patent
Morita et al.

(10) Patent No.: US 12,069,796 B2
(45) Date of Patent: Aug. 20, 2024

(54) STORAGE DEVICE UNIT

(71) Applicant: Panasonic Intellectual Property Management Co., Ltd., Osaka (JP)

(72) Inventors: Shigehito Morita, Hyogo (JP); Mitsuhiro Iizuka, Osaka (JP); Junichi Ito, Osaka (JP); Keiichi Omyo, Nara (JP); Toshiya Senoh, Nara (JP); Masato Yanai, Osaka (JP); Naoto Nishiura, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 15 days.

(21) Appl. No.: 17/563,159

(22) Filed: Dec. 28, 2021

(65) Prior Publication Data

US 2022/0124907 A1 Apr. 21, 2022

Related U.S. Application Data

(63) Continuation of application No. PCT/JP2020/025836, filed on Jul. 1, 2020.

(30) Foreign Application Priority Data

Jul. 4, 2019 (JP) .................................. 2019-125413

(51) Int. Cl.
*H05K 1/02* (2006.01)
*H01L 23/34* (2006.01)
(Continued)

(52) U.S. Cl.
CPC ......... *H05K 1/0212* (2013.01); *H01L 23/345* (2013.01); *H05K 1/0224* (2013.01);
(Continued)

(58) Field of Classification Search
CPC ............... H05K 1/0298; H05K 1/0224; H05K 2201/10022; H05K 2201/10159;
(Continued)

(56) References Cited

U.S. PATENT DOCUMENTS

| 6,114,674 A * | 9/2000 | Baugh | H05B 3/265 |
| | | | 174/250 |
| 2004/0052046 A1* | 3/2004 | Regimbal | G06F 1/184 |

(Continued)

FOREIGN PATENT DOCUMENTS

| JP | H01-174989 U | 12/1989 |
| JP | H02-231200 A | 9/1990 |
| WO | 2009/054046 A1 | 4/2009 |

OTHER PUBLICATIONS

International Search Report for related Application No. PCT/JP2020/025836, mailed Oct. 6, 2020.

*Primary Examiner* — Steven T Sawyer
(74) *Attorney, Agent, or Firm* — Renner, Otto, Boisselle & Sklar, LLP

(57) ABSTRACT

The storage device unit includes: a substrate having a main surface and having a plurality of wiring layers stacked together; and a storage device that has a plate shape having a first surface and is disposed on the substrate, the first surface facing the main surface. The plurality of wiring layers includes a heat-generating layer having a heat-generating circuit.

7 Claims, 10 Drawing Sheets

(51) Int. Cl.
*G11C 5/06* (2006.01)
*H05K 1/16* (2006.01)

(52) U.S. Cl.
CPC .............. *H05K 1/0298* (2013.01); *G11C 5/06* (2013.01); *H01L 23/34* (2013.01); *H05K 1/167* (2013.01); *H05K 2201/10022* (2013.01); *H05K 2201/10151* (2013.01); *H05K 2201/10159* (2013.01)

(58) Field of Classification Search
CPC ................. H05K 1/0212; H05K 1/167; H05K 2201/09263; H05K 2201/10151; H05K 2203/1115; H05K 2203/165; H05K 7/20445; H05K 1/181; H05K 7/20509; H05K 2201/10015; H05K 2201/10189; G11C 5/02; G11C 7/04; G11C 5/06; H01L 23/345; H01L 23/34; H01L 23/3675; H01L 25/18; H01L 23/3672; H01L 23/42; H01R 12/716; G11B 33/144
See application file for complete search history.

(56) References Cited

U.S. PATENT DOCUMENTS

| | | | | |
|---|---|---|---|---|
| 2004/0228023 A1* | 11/2004 | Keller | ................... | G11B 27/36 |
| 2004/0240174 A1* | 12/2004 | Ooka | ................... | G11B 33/121 |
| 2006/0065431 A1* | 3/2006 | Trucco | ................. | B23K 3/0307 |
| | | | | 174/250 |
| 2007/0177308 A1* | 8/2007 | Kimura | ................. | G11B 33/122 |
| | | | | 360/245.9 |
| 2009/0163079 A1* | 6/2009 | Nguyen | ................. | G11B 33/144 |
| | | | | 174/75 C |
| 2009/0268417 A1* | 10/2009 | Kagawa | ................. | G11B 33/121 |
| | | | | 361/752 |
| 2011/0122030 A1 | 5/2011 | Suzuki | | |
| 2013/0081568 A1* | 4/2013 | Happoya | ................. | H05K 3/022 |
| | | | | 118/100 |
| 2013/0094148 A1* | 4/2013 | Sloane | ................. | H05K 1/0212 |
| | | | | 361/708 |
| 2013/0180973 A1* | 7/2013 | White | ...................... | H05K 7/20 |
| | | | | 219/209 |
| 2014/0016261 A1* | 1/2014 | Lin | ........................... | G06F 1/20 |
| | | | | 361/679.33 |
| 2014/0177097 A1* | 6/2014 | Wu | ...................... | G11B 33/124 |
| | | | | 360/97.13 |
| 2014/0306335 A1* | 10/2014 | Mataya | ............... | H01L 23/3677 |
| | | | | 977/734 |
| 2015/0138735 A1* | 5/2015 | Oh | ........................ | H05K 1/181 |
| | | | | 361/736 |
| 2015/0261265 A1* | 9/2015 | Dean | ................... | G01R 31/2891 |
| | | | | 361/679.46 |
| 2017/0277234 A1* | 9/2017 | Chou | ....................... | H05B 3/26 |
| 2018/0026022 A1* | 1/2018 | Lee | ........................ | H01L 24/48 |
| | | | | 257/659 |
| 2018/0174940 A1* | 6/2018 | Ferguson | ............... | H01L 23/345 |
| 2019/0305265 A1* | 10/2019 | Wynn | ................. | H01M 50/209 |

\* cited by examiner

FIG. 3
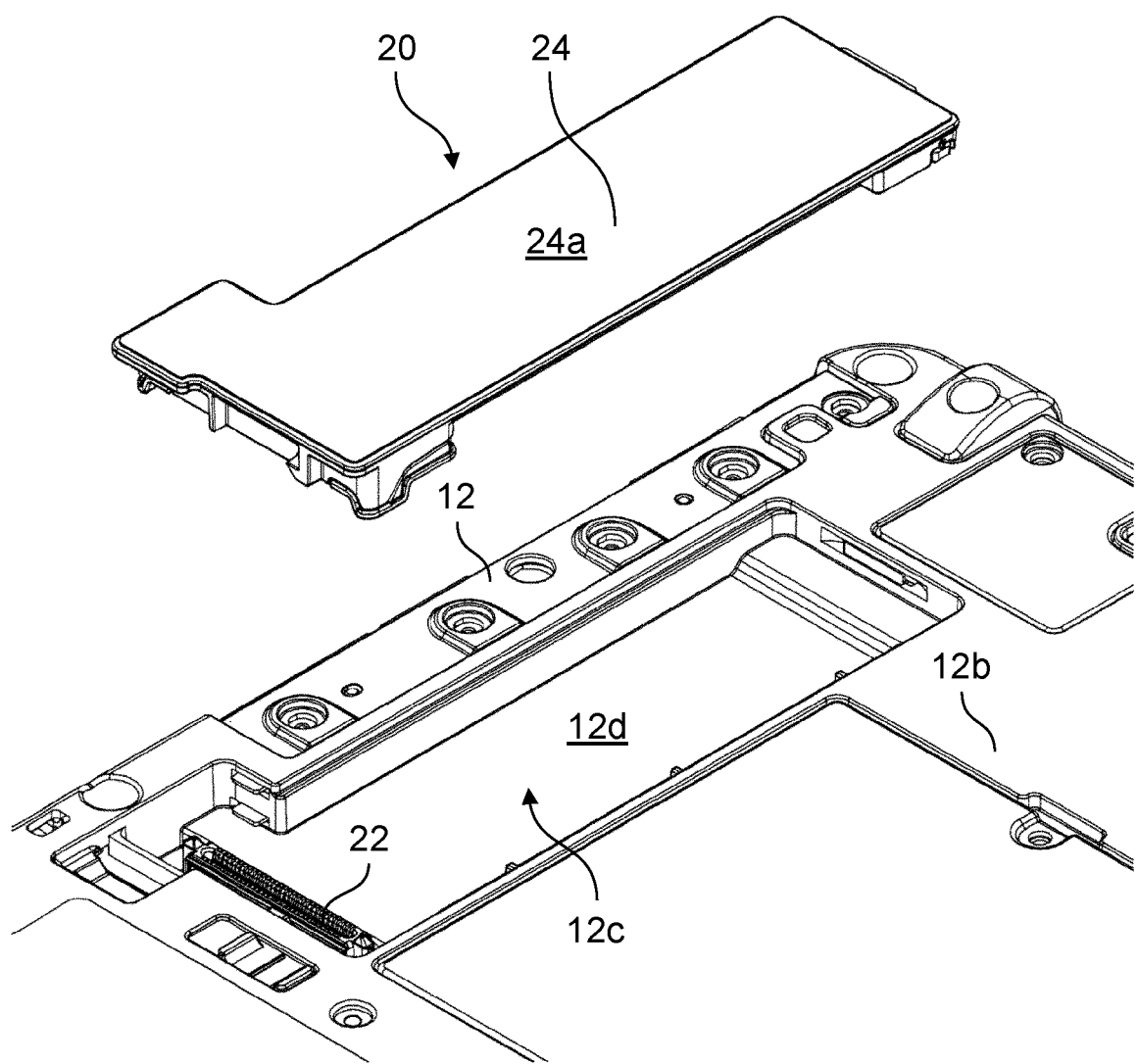
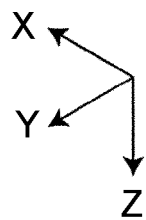

STORAGE DEVICE UNIT

TECHNICAL FIELD

The present disclosure relates to a storage device unit having a substrate on which a storage device is disposed.

BACKGROUND ART

When an electronic device on which a storage device such as a solid state drive (SSD), a hard disk drive (HDD), or a memory is mounted is used in a cold district, there is a case when the electronic device is operated at a temperature lower than the operation guarantee temperature of the storage device because the outdoor temperature is low. PTL 1 discloses a memory card including a printed circuit board on which a semiconductor memory is mounted, a frame that supports the printed circuit board, and a heater disposed on an inner surface of the frame. When the temperature of the memory card falls below the operation guarantee temperature range, the memory card is heated by the heater, and the memory can be operated within the operation guarantee temperature range.

In addition, a method of heating the storage device is also known in which a flexible printed circuit board (FPC) having a heater function is separately prepared and is disposed around the storage device. The temperature of the storage device is measured by a temperature sensor, and when the temperature is lower than the operation guarantee temperature of the storage device, the storage device can be operated within the operation guarantee temperature range by being heated with the heater.

CITATION LIST

Patent Literature

PTL 1: Unexamined Japanese Patent Publication No. 1102-231200

SUMMARY

In the case of the method using the memory card described in PTL 1 or the FPC having the heater function, there is still room for improvement in terms of reduction in manufacturing cost.

A storage device unit according to the present disclosure includes:
  a substrate having a main surface and having a plurality of wiring layers stacked together; and
  a storage device that has a plate shape having a first surface and is disposed on the substrate, the first surface facing the main surface,
  in which the plurality of wiring layers includes a heat-generating layer having a heat-generating circuit.

According to the present disclosure, the manufacturing cost can be reduced.

BRIEF DESCRIPTION OF DRAWINGS

FIG. 3 is a partial perspective view of the main body of the information processing device illustrating a state in which the storage device unit is removed from the main body of the information processing device in FIG. 1.

DESCRIPTION OF EMBODIMENT

Background Leading to the Present Disclosure

Figure 1:
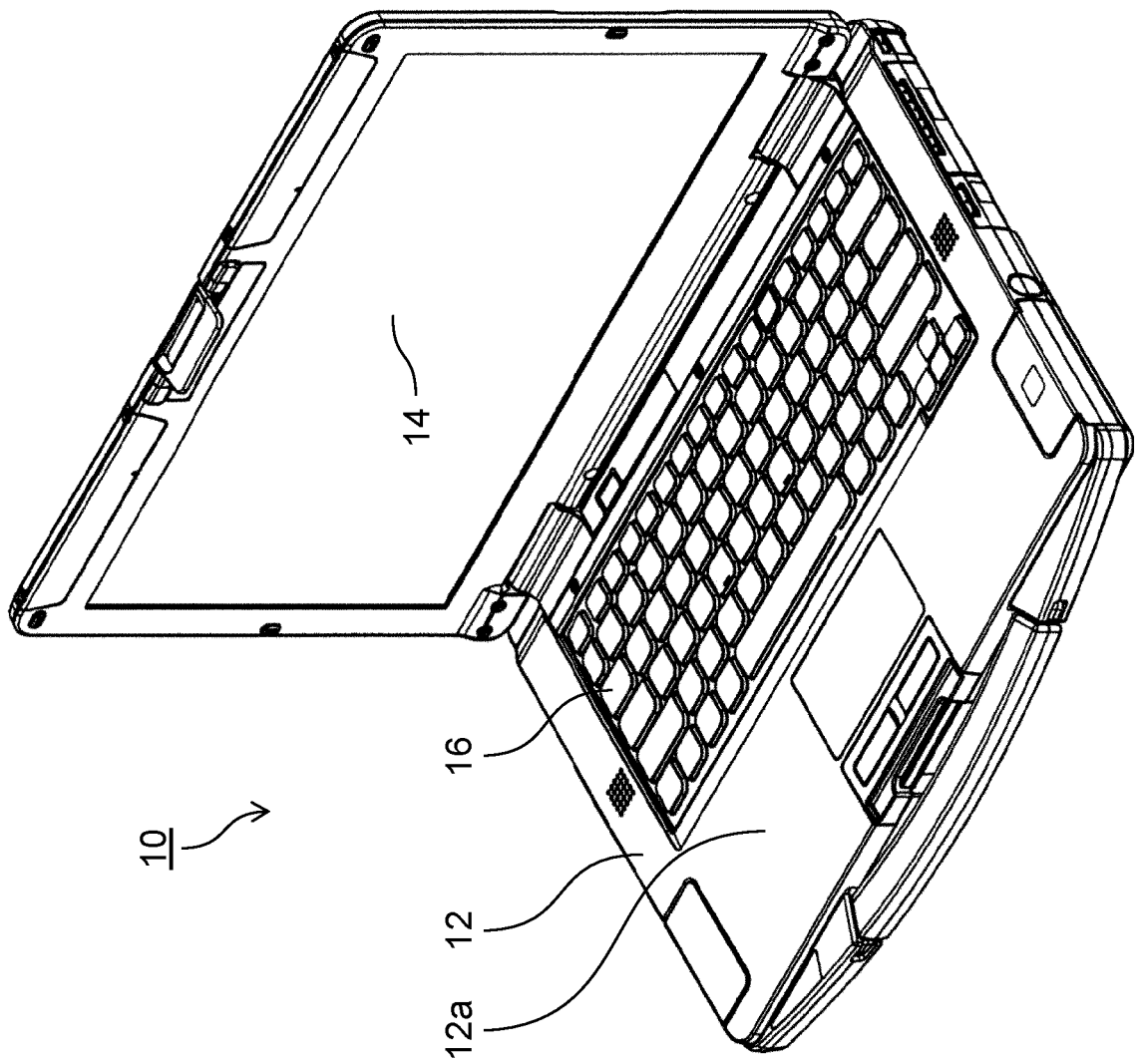
FIG. 1 is a perspective view of an information processing device on which a storage device unit according to one aspect of the present disclosure is mounted.

An electronic device such as a laptop personal computer (PC) is sometimes used outdoors. For example, when the outdoor temperature is below zero in a cold district, the temperature falls below the operation guarantee temperature of the storage device such as an SSD, an HDD, or a memory mounted in the electronic device. When the electronic device is activated in such an environment, there is a problem that the storage device does not operate normally or an access speed to the storage device becomes slower. In order to prevent this, a method of preparing an FPC on which a heater circuit is formed and disposing the FPC around the storage device is also known. For example, there is a method in which the periphery of an HDD is surrounded by the FPC in which the heater circuit is formed, and the storage device is heated when the temperature of the storage device is low at the time of activation. There is also a method in which the FPC in which the heater circuit is formed is disposed between an SSD and a substrate on which the SSD is mounted, and the SSD is heated by a heater.

In the method of heating the storage device by the FPC having the heater circuit, there is a problem that the manufacturing cost is difficult to be reduced because the costly FPC is separately prepared. In addition, there is also a problem that a work process of incorporating the storage device into an electronic device or the like is additionally required.

Therefore, the inventors of the present discloser have studied an electronic device for solving these problems and devised the following configuration.

A storage device unit according to one aspect of the present disclosure includes:
  a substrate having a main surface and having a plurality of wiring layers stacked together; and
  a storage device that has a plate shape having a first surface and is disposed on the substrate, the first surface facing the main surface,
  in which the plurality of wiring layers includes a heat-generating layer having a heat-generating circuit.

According to this configuration, the manufacturing cost can be reduced. In addition, workability at the time of manufacturing can be improved, and man-hours can be reduced.

In a view from a direction perpendicular to the main surface, the heat-generating circuit may be formed in a shape substantially identical to the storage device, and may be disposed so as to overlap the storage device.

According to this configuration, the storage device can be efficiently heated.

The storage device may be a solid state drive.

According to this configuration, in the electronic device including the SSD, the SSD can be operated within the operation guarantee temperature range by heating the SSD when the outdoor temperature is low at the time of activation.

The plurality of wiring layers may include a ground layer on which a ground pattern is formed on a side of the main surface with respect to the heat-generating layer.

According to this configuration, the heat generated from the heat-generating circuit can be efficiently transmitted to the outside of the substrate.

In the following, the present exemplary embodiment preferable to practice the present disclosure is described in detail with reference to the drawings.

First Exemplary Embodiment

Figure 2:
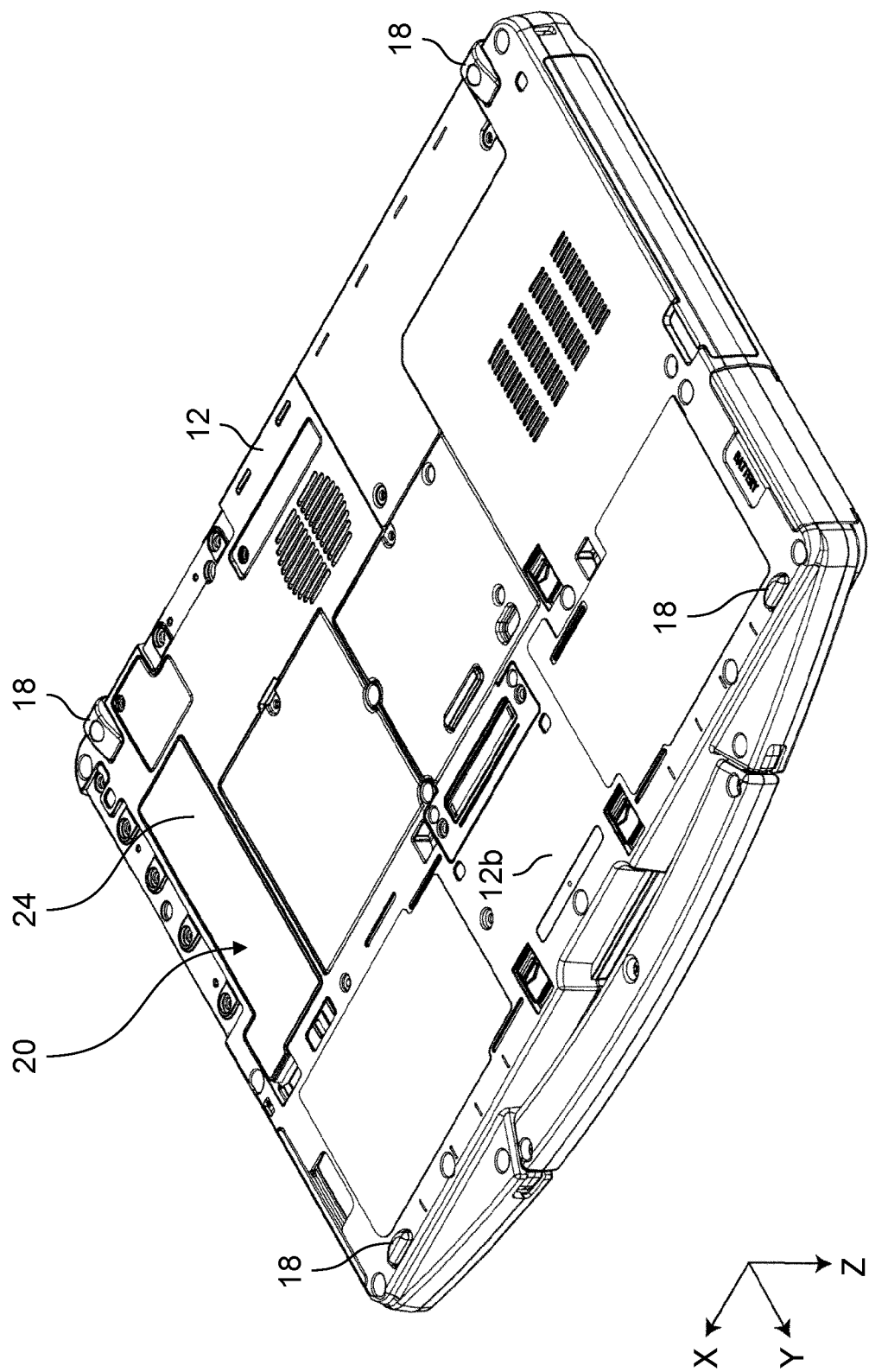
FIG. 2 is a perspective view illustrating a lower surface of a main body of the information processing device in FIG. 1.

FIG. 1 is a perspective view of information processing device 10 on which storage device unit 20 according to an aspect of the present disclosure is mounted. FIG. 2 is a perspective view illustrating lower surface 12b of main body 12 of information processing device 10 in FIG. 1. FIG. 3 is a partial perspective view of main body 12 of information processing device 10 illustrating a state in which storage device unit 20 is removed from main body 12 of information processing device 10 in FIG. 1. Note that the X-Y-Z coordinate system illustrated in the drawings is for facilitating understanding of the exemplary embodiment of the present disclosure, and does not limit the exemplary embodiment. In the X-Y-Z coordinate system, the X-axis direction is a width direction of the information processing device, the Y-axis direction is a depth direction thereof, and the Z-direction is a thickness direction thereof.

[Overall Configuration]

As illustrated in FIG. 1, information processing device 10 is a so-called laptop personal computer and includes main body 12 and display 14 rotatably attached to main body 12. Main body 12 of information processing device 10 has a plate shape whose size in the thickness direction (Z-axis direction) is smaller than the size in the width direction (X-axis direction) and the size in the depth direction (Y-axis direction). Main body 12 incorporates a central processing unit (CPU) and others, and keyboard 16 is provided on upper surface 12a thereof.

As illustrated in FIG. 2, a plurality of legs 18 are provided on lower surface 12b of main body 12 of information processing device 10. Further, storage device unit 20 is detachably incorporated in lower surface 12b.

As illustrated in FIG. 3, in the present exemplary embodiment, lower surface 12b of main body 12 is provided with recessed housing 12c that is recessed in the thickness direction (Z-axis direction) of main body 12 and houses storage device unit 20. Bottom surface 12d of housing 12c is provided with connector 22 for connecting with storage device unit 20. Connector 22 is mounted inside main body 12 and is connected to a mother board (not illustrated) on which a CPU and others are mounted via, for example, a flexible cable (not illustrated).

<Storage Service Unit>

Figure 4:
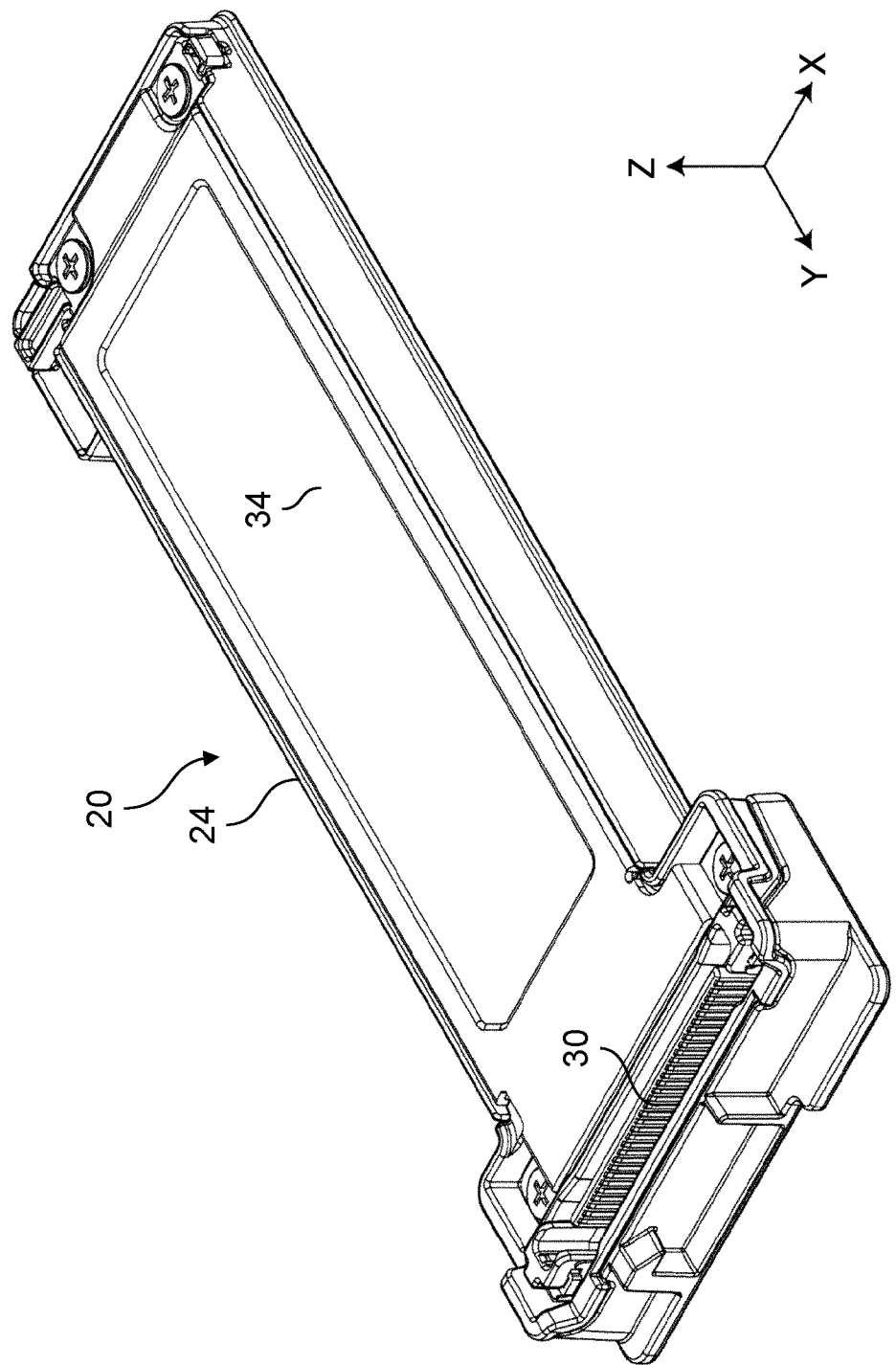
FIG. 4 is a perspective view of the storage device unit of the present disclosure.
Figure 5:
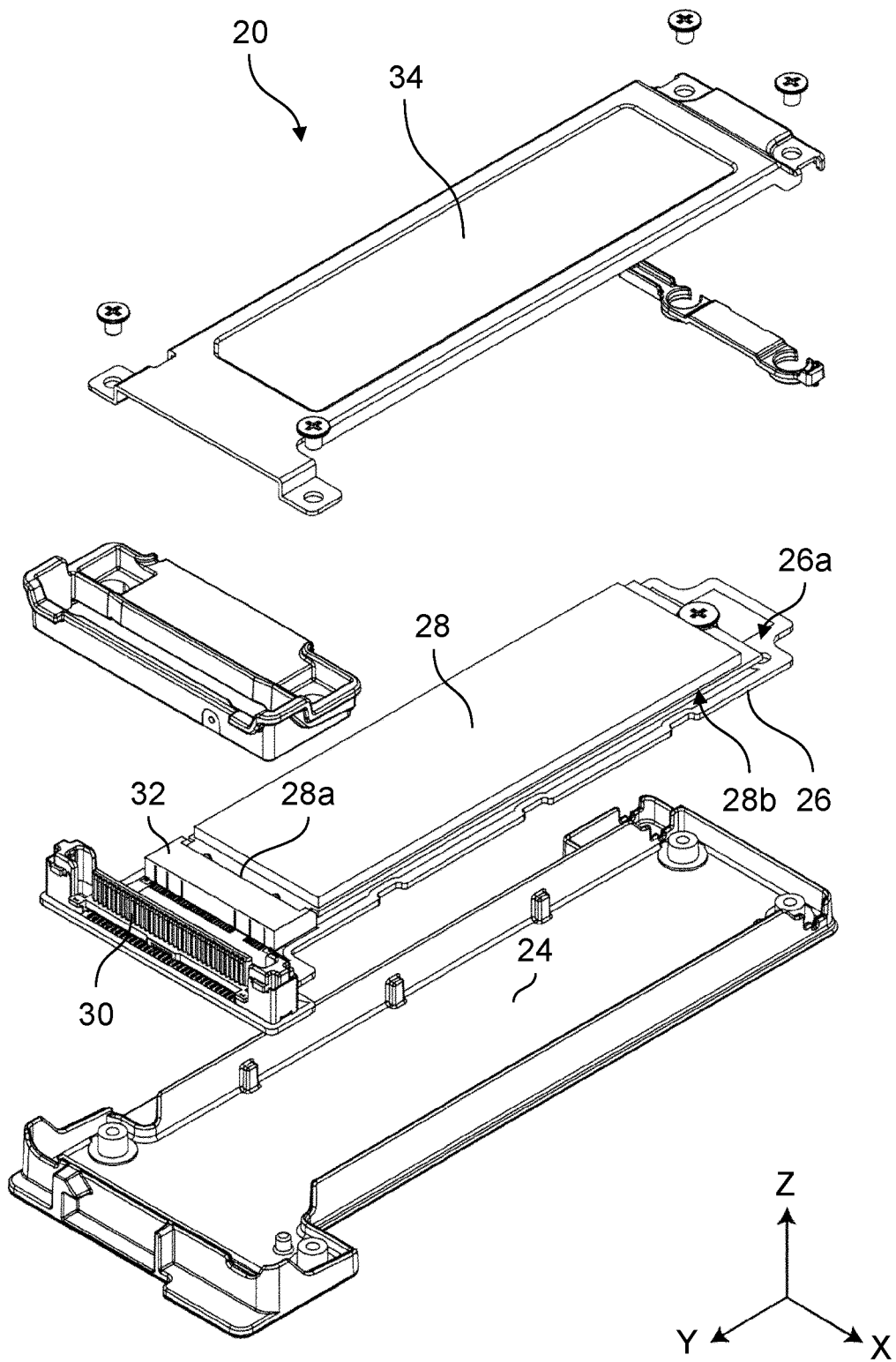
FIG. 5 is an exploded perspective view of the storage device unit in FIG. 4.
Figure 9:
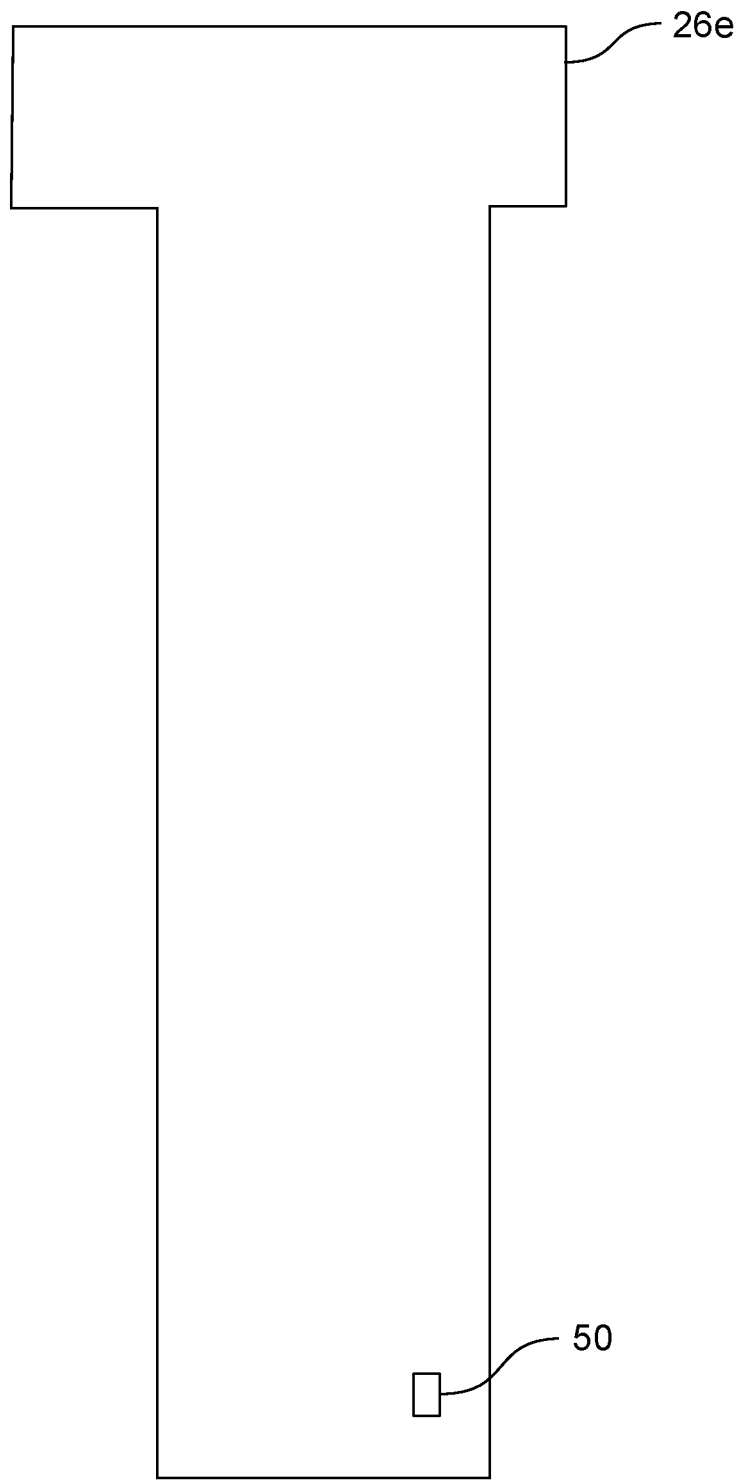
FIG. 9 is a view illustrating a first layer of the storage device unit of the present disclosure.

FIG. 4 is a perspective view of storage device unit 20 of the present disclosure. FIG. 5 is an exploded perspective view of storage device unit 20 in FIG. 4. FIG. 9 is a view illustrating first layer 26e of storage device unit 20 of the present disclosure. With reference to FIGS. 4, 5, and 9, storage device unit 20 stored in recessed housing 12c provided in lower surface 12b of main body 12 is described. Storage device unit 20 includes substrate 26 and storage device 28 disposed on substrate 26. In addition, storage device unit 20 includes casing 24, two connectors 30 and 32 mounted on main surface 26a of substrate 26, thermistor 50 (see FIG. 9) mounted on main surface 26a (surface of first layer 26e) of substrate 26, and cover 34 that covers substrate 26. Casing 24 of storage device unit 20 accommodates substrate 26, and storage device 28 is mounted on substrate 26.

<Substrate>

Figure 6:
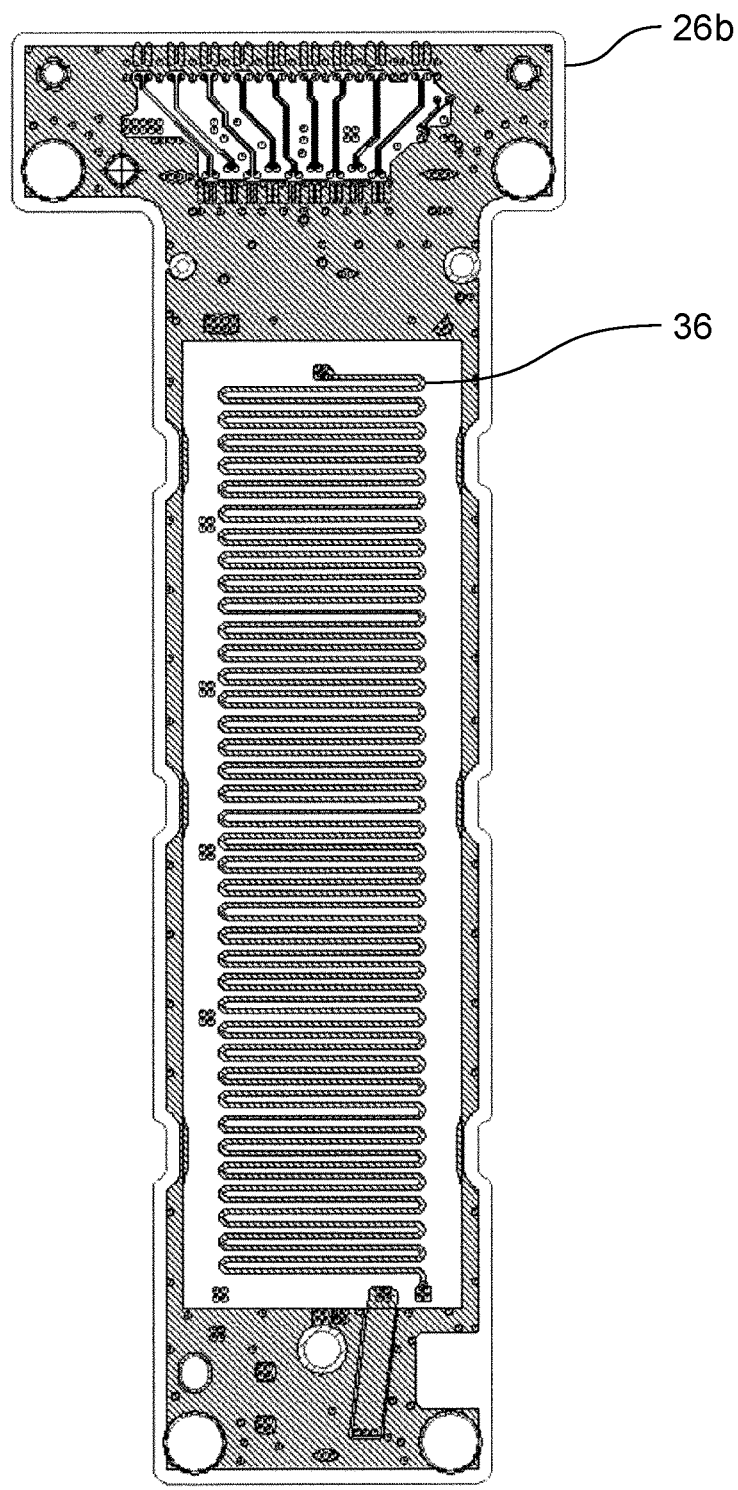
FIG. 6 is a view illustrating a heat-generating layer of the storage device unit of the present disclosure.
Figure 7:
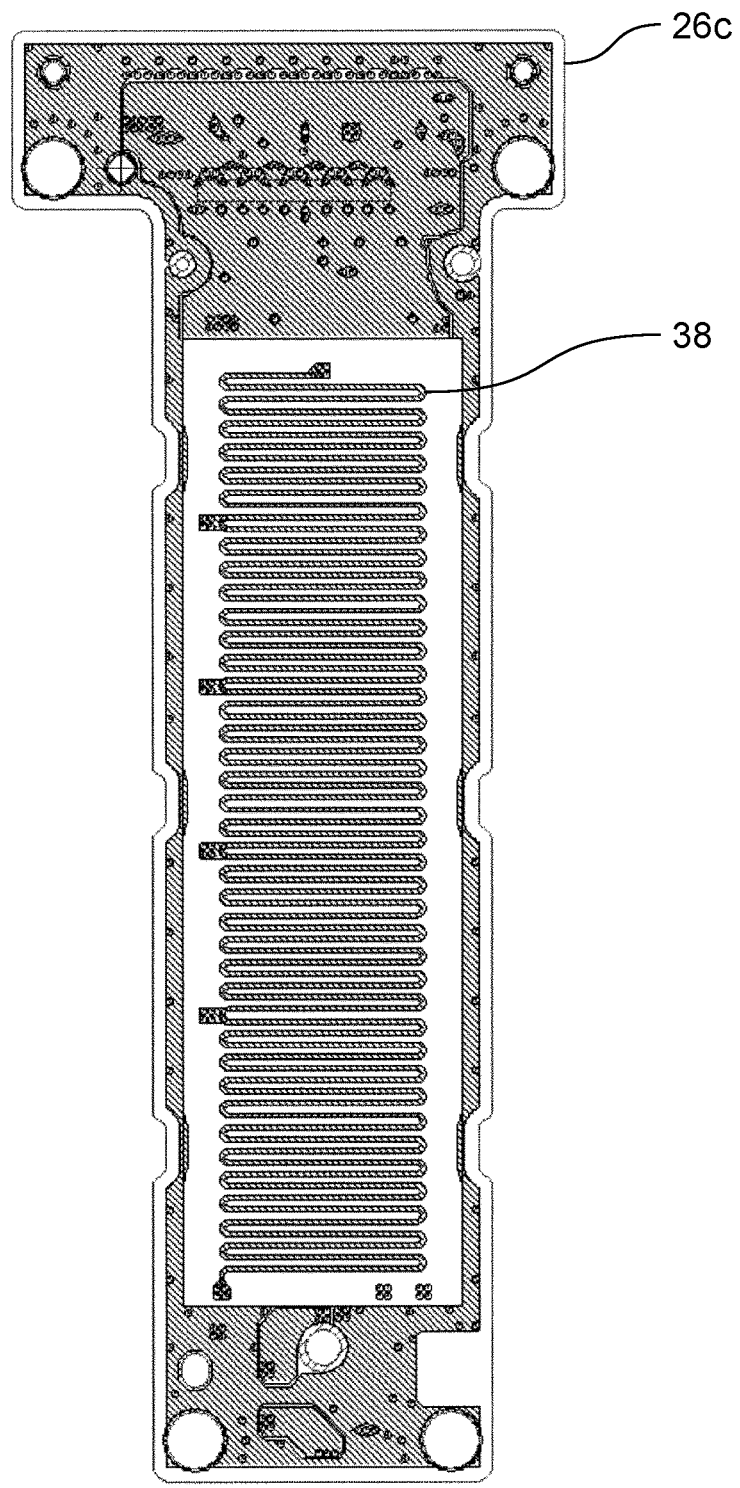
FIG. 7 is a view illustrating another heat-generating layer of the storage device unit of the present disclosure.
Figure 8:
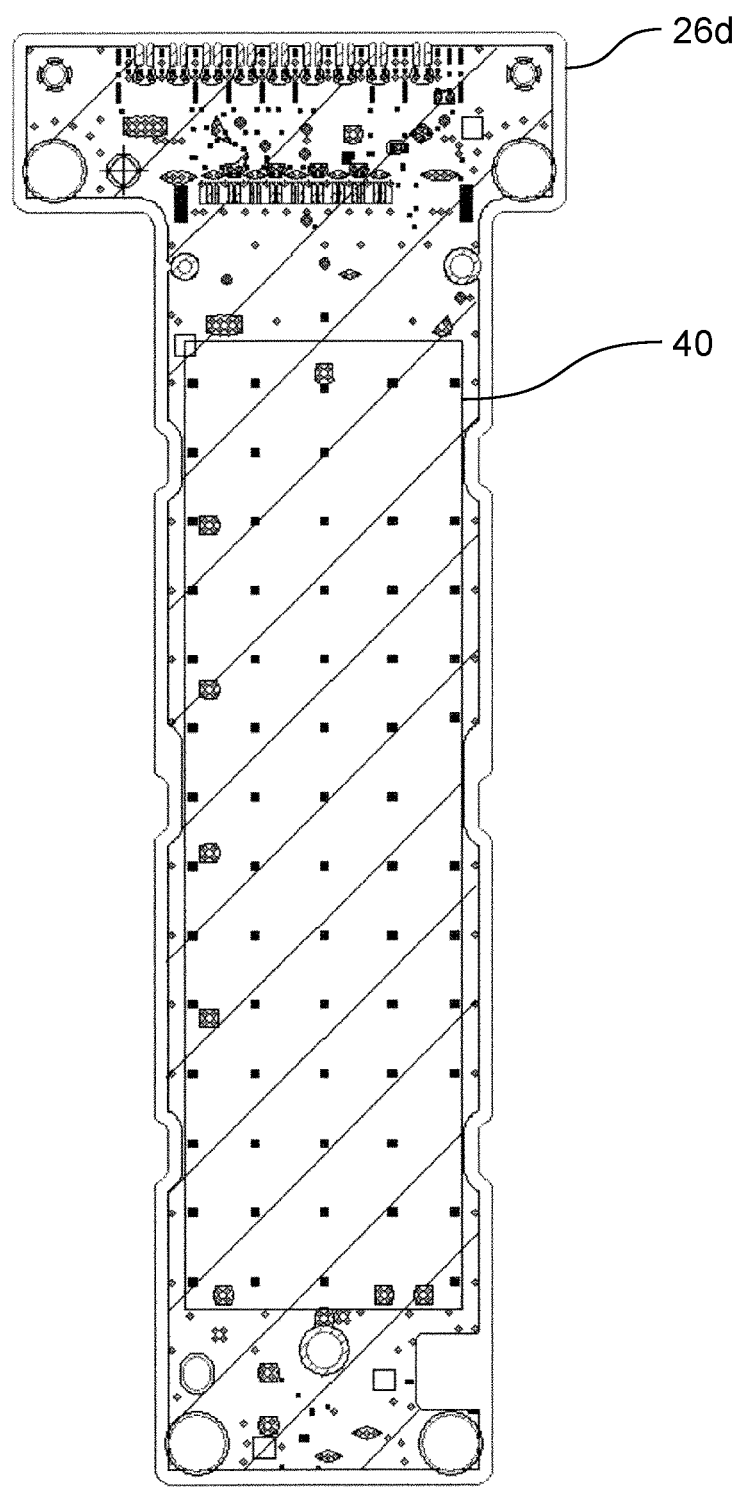
FIG. 8 is a view illustrating a ground layer of the storage device unit of the present disclosure.

FIGS. 6 and 7 are diagrams illustrating heat-generating layers 26b and 26c of storage device unit 20 of the present disclosure. FIG. 8 is a diagram illustrating ground layer 26d of storage device unit 20 of the present disclosure. Substrate 26 is formed by stacking a plurality of wiring layers. Substrate 26 is a rigid substrate made of material such as glass epoxy resin. In the present exemplary embodiment, substrate 26 has six wiring layers stacked from first layer 26e on a side of main surface 26a to the sixth layer on the opposite side of main surface 26a. That is, substrate 26 has six wiring layers stacked together. Thermistor 50 is mounted on first layer 26e (see FIG. 9) of substrate 26. First layer 26e having thermistor 50 is located between ground layer 26d and storage device 28. First layer 26e including thermistor 50 is a layer closest to storage device 28 among the six wiring layers. Thermistor 50 is a temperature sensor for measuring the temperature of storage device 28. The mounting position of thermistor 50 is more preferably provided in a region on the end side opposite to the position where connectors 30 and 32 described later are disposed in the longitudinal direction of rectangular main surface 26a. With this position, it is considered that the error between the temperature measured by thermistor 50 and the actual temperature of storage device 28 can be further reduced.

As illustrated in FIGS. 6 and 7, the plurality of wiring layers of substrate 26 includes heat-generating layers 26b and 26c having heat-generating circuits 36 and 38 in the third layer and the fourth layer, respectively. As illustrated in FIG. 8, the plurality of wiring layers of substrate 26 includes ground layer 26d in which ground pattern 40 is formed in the second layer closer to main surface 26a than heat-generating layers 26b and 26c are. Ground layer 26d is located between heat-generating layers 26b and 26c and storage device 28. In a view from a direction (Z-axis direction) perpendicular to main surface 26a of substrate 26, ground pattern 40 is disposed so as to overlap storage device 28. That is, substrate 26 of the present exemplary embodiment includes ground layer 26d in the second layer and heat-generating layers 26b and 26c in the third layer and the fourth layer among the first to sixth wiring layers.

As illustrated in FIG. 5, two connectors 30 and 32 are mounted on substrate 26. One connector 30 protrudes from substrate 26 in the thickness direction of main body 12 and is detachably connected in the thickness direction to connector 22 provided in housing 12c of main body 12. Another connector 32 is a connector to be connected to interface connector 28a of storage device 28 and is connected to interface connector 28a in a direction (Y-axis direction) orthogonal to the thickness direction (Z-axis direction) of main body 12. That is, a direction of attaching and detaching connector 22 of main body 12 to and from the connector 30 of substrate 26 is different from a direction of attaching and detaching connector 32 of substrate 26 to and from interface connector 28a of storage device 28 by 90°. Note that connector 32 is electrically connected to connector 30 via a circuit (not illustrated) on substrate 26. Therefore, storage device 28 connected to connector 32 of substrate 26 is mounted inside main body 12 with substrate 26 interposed therebetween and is electrically connected to a mother board. In other words, substrate 26 is a relay substrate that connects storage device 28 and the mother board.

With storage device unit 20 having such a structure, storage device unit 20 can be stored in housing 12c of main body 12 in the thickness direction (Z-axis direction) of main body 12. As a result, connector 22 of main body 12 and connector 30 of storage device unit 20 can be detachably connected in the thickness direction.

As illustrated in FIG. 6, heat-generating circuit 36 is formed in heat-generating layer 26b which is the third layer of substrate 26. Heat-generating circuit 36 is a wiring pattern formed of, for example, a copper foil. Heat-generating circuit 36 generates heat when current flows due to resistance of heat-generating circuit 36. As illustrated in FIG. 7, heat-generating circuit 38 having a similar configuration is also formed in heat-generating layer 26c which is the fourth layer of substrate 26. In the present exemplary embodiment, heat-generating circuits 36 and 38 are formed of copper foils, but a material constituting each of heat-generating circuits 36 and 38 is not limited thereto, and a conductor having any resistivity can be selected. Heat-generating circuits 36 and 38 can control the amount of heat to be generated by resistivity, thickness, and length of wiring.

Heat-generating circuits 36 and 38 of heat-generating layers 26b and 26c are heaters for heating storage device 28 when, for example, the outdoor temperature is low. When information processing device 10 is activated, thermistor 50 measures the temperature of storage device 28. When the temperature of storage device 28 is lower than a predetermined temperature determined from, for example, the operation guarantee temperature of storage device 28, the current flows through heat-generating circuits 36 and 38 to generate heat to heat storage device 28. Here, the predetermined temperature is, for example, a lower limit temperature (0° C.) of the operation guarantee temperature. When the temperature of storage device 28 rises to a predetermined operable temperature (for example, 2° C.) determined from the operation guarantee temperature of storage device 28 or more, the current to heat-generating circuits 36 and 38 is cut off, and the heating is terminated. Note that the control of heat-generating circuits 36 and 38 based on the temperature of storage device 28 is executed by the CPU or the like of information processing device 10. Further, the control of heat-generating circuits 36 and 38 may be executed by, for example, a microcontroller or the like mounted on substrate 26 or storage device 28. Note that the temperatures of 0° C. and 2° C. described above are examples for describing the present disclosure, and other temperatures may be used, and the present disclosure is not limited thereto.

As illustrated in FIG. 8, ground pattern 40 is formed on ground layer 26d that is the second layer of substrate 26. By disposing ground layer 26d on the main surface side of heat-generating layers 26b and 26c, that is, on the side of storage device 28, heat generated in heat-generating circuits 36 and 38 can be efficiently transmitted to storage device 28.

<Storage Device>

In the present exemplary embodiment, an SSD is mounted on substrate 26 as storage device 28. As illustrated in FIG. 5, storage device 28 is formed in a plate shape having first surface 28b. That is, storage device 28 has a plate shape. By connecting connector 32 mounted on substrate 26 and interface connector 28a of storage device 28, first surface 28b of storage device 28 and main surface 26a of substrate 26 are disposed to face each other. Because storage device 28 is mounted on substrate 26 in this manner, storage device 28 can be heated by the heat generated in heat-generating circuits 36 and 38 of substrate 26. In the present exemplary embodiment, substrate 26 and storage device 28 are disposed so as not to be in contact with each other. That is, first surface 28b of storage device 28 is disposed away from main surface 26a of substrate 26. By disposing in this manner, storage device 28 can be prevented from being locally heated.

In a view from the direction (Z-axis direction) perpendicular to main surface 26a of substrate 26, heat-generating circuits 36 and 38 are preferably formed in substantially the same shape as storage device 28 and disposed so as to overlap storage device 28. That is, the shapes of heat-generating circuits 36 and 38 may be substantially the same as the shape of storage device 28 in the view from the direction (Z-axis direction) perpendicular to main surface 26a of substrate 26. By disposing heat-generating circuits 36 and 38 so as to overlap storage device 28, storage device 28 can be efficiently heated.

The SSD adopted as storage device 28 of the present exemplary embodiment generally has the operation guarantee temperature of about 0° C. to 40° C. When the outdoor temperature falls below zero in such as a cold district, there is a case where the temperatures of information processing device 10 and storage device 28 mounted on information processing device 10 also fall below 0° C. In this case, storage device 28 can be used within the operation guarantee temperature range of storage device 28 by heating storage device 28 by heat-generating circuits 36 and 38.

[Operation]

An operation of information processing device 10 having the above configuration is described.

(1) When information processing device 10 is activated, thermistor 50 measures the temperature of storage device 28.

(2) If the temperature of storage device 28 is, for example, lower than 0° C., current flows through heat-generating circuits 36 and 38 of heat-generating layers 26b and 26c, and storage device 28 is started to be heated. At this time, storage device 28 is not energized, and storage device 28 cannot be used. The current through heat-generating circuits 36 and 38 and the energization of storage device 28 are controlled by, for example, the CPU or the like.

(3) When the temperature of storage device 28 becomes, for example, 2° C. or higher, the current to heat-generating circuits 36 and 38 is cut off, and the heating of storage device 28 is terminated.

(4) When the heating of storage device 28 is terminated, the energization of storage device 28 is started, and storage device 28 becomes usable.

[Effects]

According to the present exemplary embodiment, storage device 28 can be heated by providing heat-generating circuits 36 and 38 on substrate 26 on which storage device 28 is mounted, without preparing an FPC having a heater circuit. Therefore, the manufacturing cost can be reduced as compared with the case of using the FPC having the heater circuit. In addition, because the process of incorporating the FPC having the heater circuit into storage device unit 20 is not necessary, the manufacturing man-hours can be reduced and the productivity can be improved.

The present disclosure has been described by taking the above exemplary embodiment as an example, but the present disclosure is not limited to the above exemplary embodiment.

For example, in the present exemplary embodiment, heat-generating circuits 36 and 38 are formed in two wiring layers among the six wiring layers of substrate 26, but the heat-generating circuits may be formed in one or three or more wiring layers among the wiring layers of substrate 26 by adjusting the thickness and length of the wiring. The thickness and length of the wiring of heat-generating circuit may be determined by the amount of heat generation required to heat storage device 28.

In the present exemplary embodiment, among the six wiring layers of substrate 26, the third layer and the fourth layer are heat-generating layers 26b and 26c, and heat-generating circuits 36 and 38 are formed in heat-generating layers 26b and 26c, respectively. However, the heat-generating layer can be any wiring layer among the plurality of wiring layers of substrate 26. Preferably, the heat-generating circuit is formed using the wiring layer located in the inner layer as the heat-generating layer. By using the wiring layer located in the inner layer as the heat-generating layer, a short circuit can be prevented.

Further, in the present exemplary embodiment, substrate 26 is formed by stacking six wiring layers, but a number of wiring layers is not limited thereto. Further, in the present exemplary embodiment, storage device 28 is disposed on main surface 26a of substrate 26, but the storage device may also be mounted on a surface of substrate 26 opposite to main surface 26a. In this case, it is preferably that the ground layer be formed on the wiring layer located on the side of main surface 26a of substrate 26 of the heat-generating layer and be also formed on the wiring layer located on the opposite side of main surface 26a of substrate 26 of the heat-generating layer.

Figure 7A:
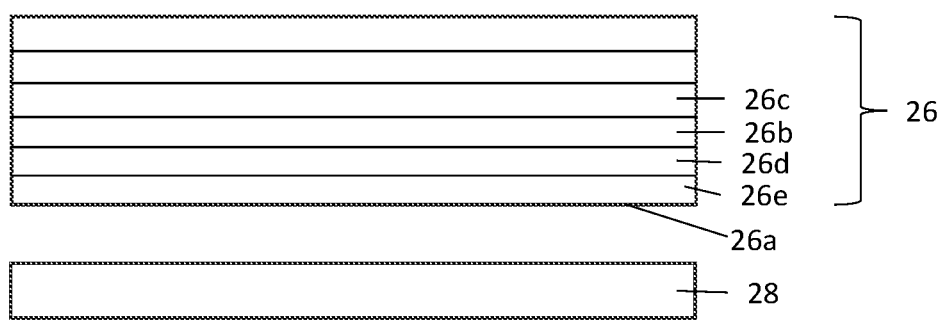
FIG. 7A is a view illustrating the first major surface of the storage device being spaced apart from the main surface of the substrate.

Further, in the present exemplary embodiment, substrate 26 and storage device 28 are disposed so as not to be in contact with each other (shown schematically in FIG. 7A). However, for example, a material having a high thermal conductivity may be disposed between substrate 26 and storage device 28, or substrate 26 and storage device 28 may be disposed in contact with each other. In this case, storage device 28 can be heated more efficiently.

In the present exemplary embodiment, the SSD is adopted as storage device 28, but storage device 28 may be an HDD, a memory, or the like.

INDUSTRIAL APPLICABILITY

The present disclosure is applicable to a storage device unit in which a storage device is disposed on a substrate and to an information processing device including the storage device unit.

REFERENCE MARKS IN THE DRAWINGS 20 storage device unit
26 substrate
26a main surface
26b heat-generating layer
26c heat-generating layer
26d ground layer
26e first layer
28 storage device
36 heat-generating circuit
38 heat-generating circuit
40 ground pattern
50 thermistor

The invention claimed is:

1. A storage device unit comprising:
a substrate having a main surface and having a plurality of wiring layers stacked together; and
a storage device that has a plate shape having a first major surface and a second major surface parallel and opposite to the first major surface;
wherein the plurality of wiring layers includes a heat-generating layer having a heat-generating circuit,
the first major surface of the storage device faces the main surface of the substrate,
the plurality of wiring layers includes a ground layer having a ground pattern, the ground layer is provided between the heat-generating layer and the storage device,
the plurality of wiring layers includes a layer having a thermistor, the layer having the thermistor is located between the ground layer and the storage device,
the layer having the thermistor is a layer closest to the storage device among the plurality of wiring layers, and
the thermistor is provided in a first end region of the substrate, the first end region being opposite to a second end region of the substrate in a longitudinal direction of the substrate, the second end region of the substrate being where a connector is disposed on the main surface of the substrate.

2. The storage device unit according to claim 1, wherein in a view from a direction perpendicular to the main surface, the heat-generating circuit is disposed to overlap the storage device.

3. The storage device unit according to claim 2, wherein in the view from the direction perpendicular to the main surface, the heat-generating circuit has a shape substantially identical to a shape of the storage device.

4. The storage device unit according to claim 1, wherein the storage device is a solid state drive.

5. The storage device unit according to claim 1, wherein in the view from the direction perpendicular to the main surface, the ground pattern is disposed to overlap the storage device.

6. The storage device unit according to claim 1, wherein the first major surface of the storage device is spaced apart from the main surface of the substrate.

7. The storage device unit according to claim 1, wherein the plurality of wiring layers includes a plurality of the heat-generating layers.

* * * * *